(12) United States Patent
Takahashi

(10) Patent No.: US 6,788,580 B2
(45) Date of Patent: Sep. 7, 2004

(54) NONVOLATILE SEMICONDUCTOR STORAGE DEVICE AND DATA ERASING METHOD

(75) Inventor: Satoshi Takahashi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/454,630

(22) Filed: Jun. 5, 2003

(65) Prior Publication Data
US 2003/0206435 A1 Nov. 6, 2003

Related U.S. Application Data

(63) Continuation of application No. PCT/JP00/09109, filed on Dec. 21, 2000.

(51) Int. Cl.⁷ .................................. G11C 16/06
(52) U.S. Cl. .................. 365/185.2; 365/185.29; 365/185.16
(58) Field of Search .................... 365/185.2, 185.29, 365/185.16, 185.26, 185.28, 185.21

(56) References Cited

U.S. PATENT DOCUMENTS

| 5,657,272 A | 8/1997 | Sato |
| 6,339,540 B1 * | 1/2002 | Lavi ........................ 365/49 |
| 6,577,532 B1 * | 6/2003 | Chevallier ............ 365/185.03 |

FOREIGN PATENT DOCUMENTS

| EP | 0 403 822 | 12/1990 |
| JP | 2000-30471 | 1/2000 |

* cited by examiner

Primary Examiner—David Lam
(74) Attorney, Agent, or Firm—Arent Fox PLLC

(57) ABSTRACT

A nonvolatile semiconductor storage device includes a memory cell array and a reference cell providing a reference level with which data of the memory cell array is compared with so as to determine whether the data of the memory cell array is in an over-programmed state.

11 Claims, 5 Drawing Sheets

NONVOLATILE SEMICONDUCTOR STORAGE DEVICE AND DATA ERASING METHOD

This is a continuation of application No. PCT/JP00/09609, filed Dec. 21, 2000.

TECHNICAL FIELD

The present invention generally relates to semiconductor storage devices, and more particularly to a NOR-type nonvolatile semiconductor storage device formed of a virtual ground array.

BACKGROUND ART

In flash memories, in the case of performing erasing by the sector, writing is performed to all the bits in the sector before an erasing operation (hereinafter referred to as preprogramming), and thereafter, the erasing operation is performed.

In the case of performing a programming operation of writing an electric charge (electrons) to a memory cell, a verifying operation of confirming whether the electric charge is injected into the memory cell is performed, and the programming operation is repeatedly performed until the verification result becomes "PASS." Likewise, in the case of performing an erasing operation of extracting an electric charge (electrons) from a memory cell, a verifying operation of confirming whether the electric charge is extracted from the memory cell is performed, and the erasing operation is repeatedly performed until the verifying result becomes "PASS."

Generally, the verifying operation in the programming operation (program-verifying operation) and the verifying operation in the erasing operation (erase-verifying operation) are performed at different levels in order to secure a margin at the time of reading. The programmed cells have thresholds distributed on or above the program-verifying level, and the erased cells have thresholds distributed on or below the erase-verifying level.

As a result of a writing operation, such a state may be entered that the threshold of a cell transistor is too high (hereinafter referred to as over-programming). In NOR-type flash memories, even if over-programming occurs, the reading operation itself is not affected. However, the erasing operation has to be performed many times so as to erase a cell on which writing is deeply performed (an over-programmed cell) with the result that the other cells that are erased together are over-erased. Further, as writing is repeated, the threshold distribution after erasing broadens, which may lead to an increase in erasing time. Particularly, in a flash memory of a type storing electric charges in a nitride film, over-programming has a very significant effect on the increase in erasing time.

DISCLOSURE OF THE INVENTION

In view of the above, it is a general object of the present invention to provide a semiconductor storage device in which the above-described disadvantages are eliminated.

A more specific object of the present invention is to provide a semiconductor storage device that has a good rewriting characteristic without being affected by over-programming.

The above objects of the present invention are achieved by a nonvolatile semiconductor storage device including a memory cell array and a reference cell providing a reference level with which data of the memory cell array is compared so as to determine whether the data of the memory cell array is in an over-programmed state.

The above-described nonvolatile semiconductor storage device may further include a comparator circuit and a control circuit controlling the comparator circuit so that the comparator circuit compares the data of the memory cell array with the reference level of the reference cell, the control circuit performing an erasing operation on a memory cell in the over-programmed state in the memory cell array when a result of the comparison shows the over-programmed state.

In addition, in the above-described nonvolatile semiconductor storage device, the control circuit may control the comparator circuit so that the comparator circuit compares the data of the memory cell array with the reference level of the reference cell after writing to all bits in a sequence of operations of erasing the memory cell array is completed, the control circuit performing the erasing operation on the memory cell in the over-programmed state in the memory cell array when the result of the comparison shows the over-programmed state.

According to the above-described nonvolatile semiconductor storage device, after pre-programming in the erasing sequence, it is determined, with respect to each memory cell, whether the memory cell is over-programmed. The erasing operation is performed on the memory cell determined to be over-programmed until its over-programmed state disappears. Thereby, it can be ensured that an over-programmed memory cell state is eliminated before applying the erasing operation to the entire sector. Thereby, over-erasing due to erasing the entire sector at one time can be controlled, and the broadening of the threshold distribution after erasing can be controlled so that an increase in erasing time can be avoided. It is preferable that the over-programming detection operation be performed not after a normal writing operation but only after pre-programming. Since over-programming does not affect the reading itself of data from a memory cell, it is more time-efficient to correct over-programming in the erasing sequence.

Further, in the above-described nonvolatile semiconductor storage device, the memory cell array may include a memory cell transistor storing data by storing an electric charge in a nitride film. The memory cell transistor may store two bits independent of each other by storing an electric charge in both ends of the nitride film.

This nonvolatile semiconductor storage device employs the nitride film as an electric charge trapping layer, so that the electric charge spreads spatially in the over-programmed state. This prevents the spatially spreading electric charge from being erased sufficiently by a single erasing operation. Accordingly, the configuration of detecting and correcting over-programming according to the present invention is extremely effective in suppressing an increase in erasing time in this nonvolatile semiconductor storage device, that is, a nonvolatile semiconductor storage device using a nitride film.

The above objects of the present invention are also achieved by a method of erasing data in a nonvolatile semiconductor storage device, the method including the steps of: (a) programming all of a plurality of memory cells in a region to be erased in a memory cell array; (b) determining, with respect to each of the memory cells, whether the memory cell is in an over-programmed state by comparing data of the memory cell with a predetermined reference level; (c) causing the over-programmed state of a memory cell determined to be in the over-programmed state to disappear by performing an erasing operation on the memory cell; and (d) erasing all the memory cells in the region to be erased in the memory cell array after eliminating the over-programmed state from the entire region to be erased.

According to the above-described method, it can be ensured that an over-programmed memory cell state is eliminated before applying the erasing operation to the entire sector. Thereby, over-erasing due to erasing the entire sector at one time can be controlled, and the broadening of the threshold distribution after erasing can be controlled so that an increase in erasing time can be avoided.

BRIEF DESCRIPTION OF THE DRAWINGS

Other objects, features and advantages of the present invention will become more apparent from the following detailed description when read in conjunction with the accompanying drawings, in which.

BEST MODE FOR CARRYING OUT THE INVENTION

An expatiation will be given, with reference to the accompanying drawings, of an embodiment of the present invention.

Figure 1:
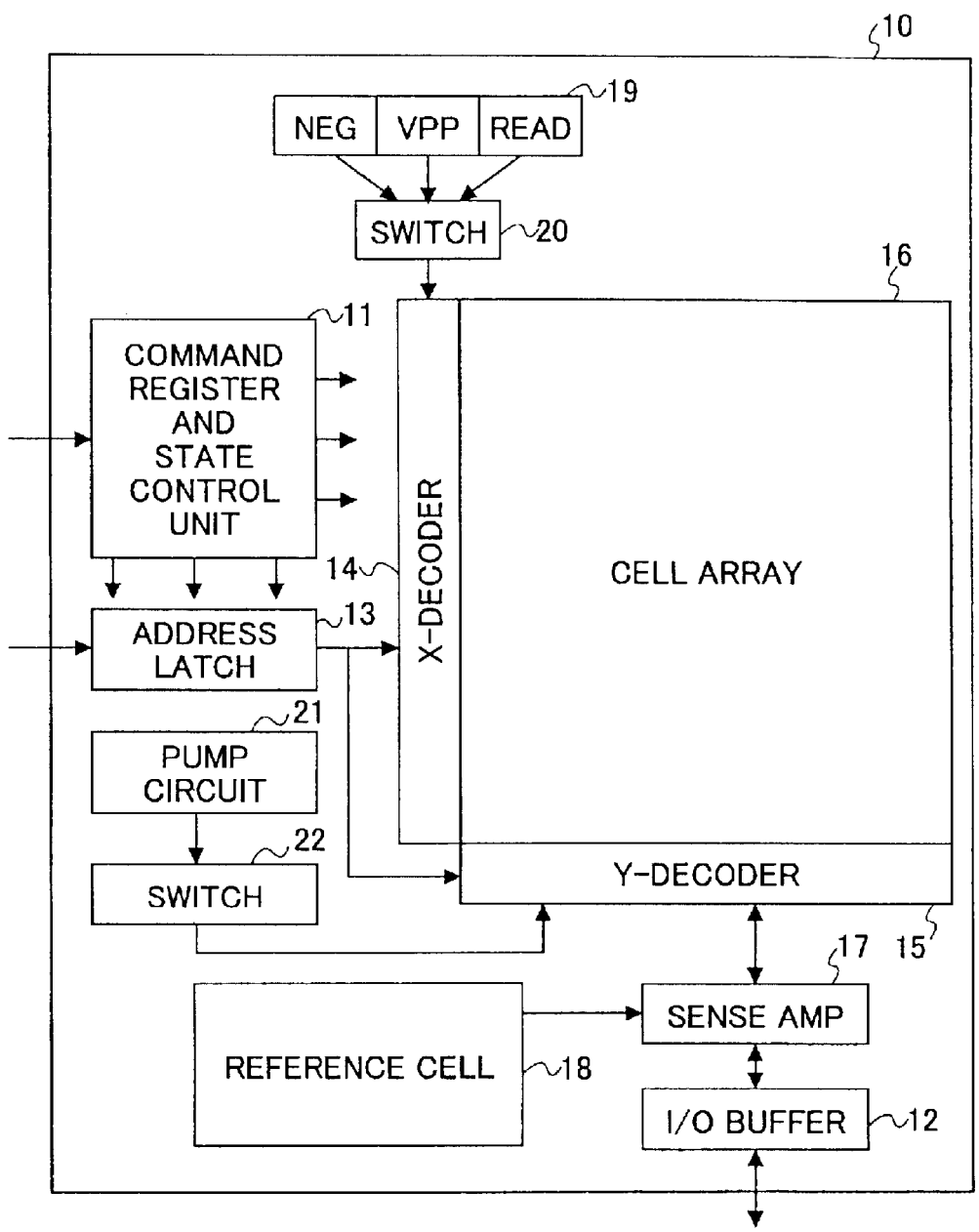
FIG. 1 is a block diagram showing the configuration of a semiconductor storage device according to the present invention.

FIG. 1 is a block diagram showing the configuration of a semiconductor storage device 10 according to the present invention.

The semiconductor storage device 10 of FIG. 1 includes a command register and state control unit 11, an input/output (I/O) buffer 12, an address latch 13, an X-decoder 14, a Y-decoder 15, a cell array 16, a sense amplifier (comparator circuit) 17, a reference cell 18, a voltage supply unit 19, a switch circuit 20, a pump circuit 21, and a switch circuit 22.

The command register and state control unit 11 receives a control signal and a command from the outside, and as a command register, stores the command. The command register and state control unit 11 further operates as a state machine based on the control signal and the command, controlling each part of the semiconductor storage device 10.

The I/O buffer 12 receives data from the outside and supplies the data to the sense amplifier (comparator circuit) 17. The address latch 13 receives and latches an address signal supplied from the outside, and supplies the address signal to the X-decoder 14 and the Y-decoder 15. The X-decoder 14 decodes the address supplied from the address latch 13, and activates a word line provided in the cell array 16 based on the decoding result. The Y-decoder 15 decodes the address supplied from the address latch 13, and selectively connects the bit lines of the cell array 16 to the sense amplifier (comparator circuit) 17 based on the decoded address signal. Thereby, the data reading/writing channel with respect to the cell array 16 is established.

The cell array 16 includes an array of memory cells, word lines, and bit lines, and stores information in each memory cell. At the time of reading out data, the data from the memory cells specified by an activated word line are supplied to the Y-decoder 15. At the time of programming or erasing, the word lines and the bit lines are set to appropriate potentials in accordance with the operation, thereby performing the operation of injecting electric charges into or extracting electric charges from the memory cells.

The sense amplifier (comparator circuit) 17 compares the level of data supplied via the Y-decoder 15 from the cell array 16 with a reference level indicated by the reference cell 18, thereby determining whether the data bit is 0 or 1. The determination result is supplied as read-out data to the I/O buffer 12. Further, the verifying operation accompanying the programming operation and the erasing operation is also performed by comparing the level of data supplied via the Y-decoder 15 from the cell array 16 with reference levels indicated by the reference cell 18.

The reference cell 18 includes memory cells for reference. The reference cell 18, operating under the control of the command register and state control unit 11, generates reference levels employed in data determination using the memory cells for reference and supplies the reference levels to the sense amplifier (comparator circuit) 17.

The voltage supply unit 19 supplies the switch circuit 20 with a negative high potential NEG to be applied to the word line at the time of the erasing operation, a high potential VPP to be applied to the word line at the time of the programming operation, and a reading potential READ to be applied to the word line at the time of the reading operation. The switch circuit 20, operating under the control of the command register and state control unit 11, selects and supplies to the X-decoder 14 one of the potentials supplied from the voltage supply unit 19 which one corresponds to a specified operation.

The pump circuit 21 generates a voltage higher than a supply voltage using a circuit utilizing an oscillator and capacitance coupling, and supplies the generated voltage to the switch circuit 22. The switch circuit 22, operating under the control of the command register and state control unit 11, supplies the high voltage generated by the pump circuit 21 to the Y-decoder 15. Thereby, the Y-decoder sets the drain-side bit line of a memory cell at high voltage at the time of the programming operation and the erasing operation.

In the present invention, the reference cell 18 includes a reference cell for the reading operation, a reference cell for the programming operation, a reference cell for the erasing operation, and a reference cell for over-programming. The reference cell 18, using the reference cell for over-programming, generates an over-programming reference potential for detecting over-programming. At the time of the erasing operation, after pre-programming, the command register and state control unit 11 performs an over-programming detecting operation of detecting an over-programmed cell, thereby detecting an over-programmed cell. Then, the command register and state control unit 11 performs the erasing operation independently on the detected cell, thereby causing the over-programmed state of the detected cell to disappear.

Figure 2:
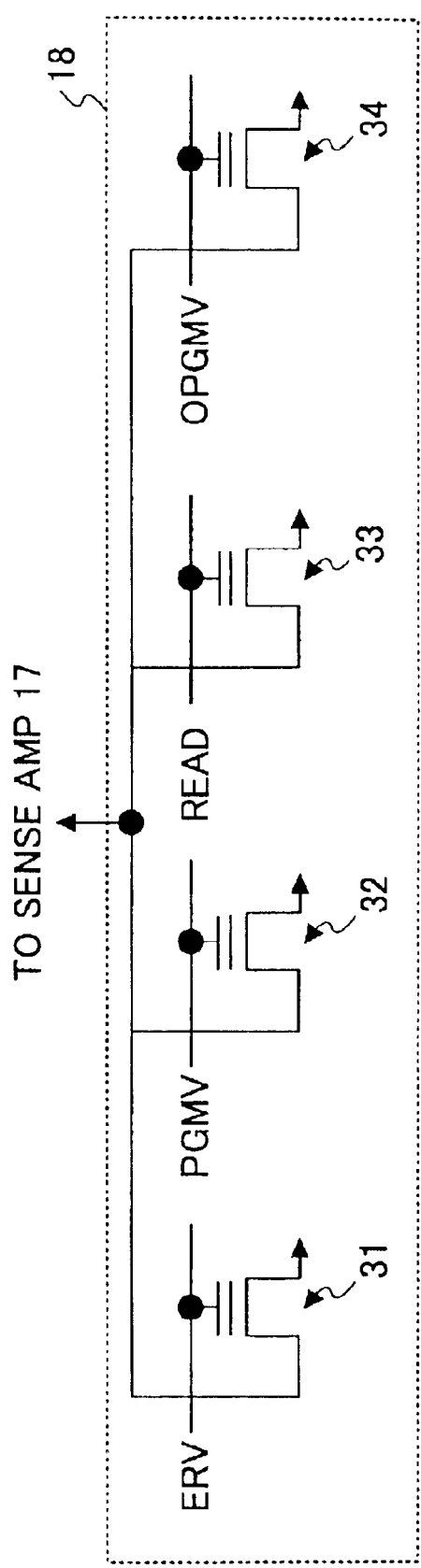
FIG. 2 is a circuit diagram showing the configuration of a reference cell according to the present invention.

FIG. 2 is a circuit diagram showing the configuration of the reference cell 18.

As shown in FIG. 2, the reference cell 18 includes a reference cell 31 for the erasing operation, a reference cell 32 for the programming operation, a reference cell 33 for the reading operation, and a reference cell 34 for over-programming. The reference cell 31 receives, as a gate input, a potential ERV that is activated during the erase-verifying operation, and supplies the sense amplifier 17 with a reference current or a reference voltage that is referred to in the erase-verifying operation. The reference cell 32 receives, as a gate input, a potential PGMV that is activated during the program-verifying operation, and supplies the sense amplifier 17 with a reference current or a reference voltage that is referred to in the program-verifying operation. The reference cell 33 receives, as a gate input, a potential READ that is activated during the reading operation, and supplies the sense amplifier 17 with a reference current or a reference voltage that is referred to in the reading operation. The reference cell 34 receives, as a gate input, a potential OPGMV that is activated during the over-programming detecting operation, and supplies the sense amplifier 17 with a reference current or a reference voltage that is referred to in the over-programming detecting operation.

Figure 3:
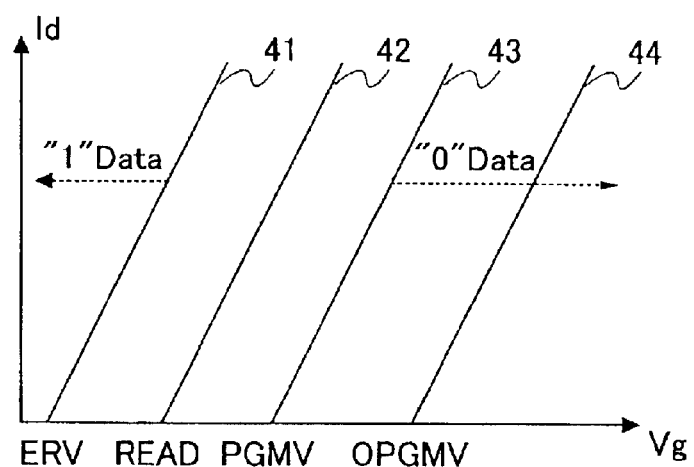
FIG. 3 is a schematic diagram showing reference levels according to the present invention.

FIG. 3 is a schematic diagram showing reference levels according to the present invention.

The horizontal and vertical axes of FIG. 3 represent the gate voltage Vg and the drain current Id, respectively, of a cell transistor. The reference level shown by the reference cell 31 for the erasing operation of the reference cell 18 is a level as shown as a Vg-Id characteristic 41. Likewise, the reference levels shown by the reference cells 32 through 34 of the reference cell 18 are levels as shown as Vg-Id characteristics 42 through 44, respectively.

First, in the case of performing the programming operation, the sense amplifier 17 compares data from a programmed memory cell in the cell array 16 with the program-verifying reference level shown as the Vg-Id characteristic 43, and performs the verifying operation. If the data of the memory cell shows a potential higher than the program-verifying reference potential, it is determined that the memory cell is reliably programmed (the data bit of "0" is written). In the case of performing the erasing operation, the sense amplifier 17 compares data from an erased memory cell in the cell array 16 with the erase-verifying reference level shown as the Vg-Id characteristic 41, and performs the verifying operation. If the data of the memory cell shows a potential lower than the erase-verifying reference potential, it is determined that the memory cell is reliably erased (the data bit of "1" is written). In each of the programming operation and the erasing operation, if the verification result is "FAIL," the programming or erasing operation is repeatedly performed until the verification result becomes "PASS."

When the reading operation is performed on the memory cell after the memory cell is thus programmed or erased, the sense amplifier 17 compares data read out from the cell array 16 with the reading reference level shown as the Vg-Id characteristic 42. If the read-out data shows a potential higher than the reference potential, it is determined that the memory cell is programmed, and if the read-out data shows a potential lower than the reference potential, it is determined that the memory cell is erased.

In the present invention, in addition to the above-described operations, the over-programming detecting operation is performed. In the over-programming detecting operation, the sense amplifier 17 compares data from a target memory cell in the cell array 16 with the over-programming detecting reference level shown as the Vg-Id characteristic 44. If the data of the memory cell shows a potential higher than the over-programming detecting reference level, it is determined that the memory cell is over-programmed.

Figure 4:
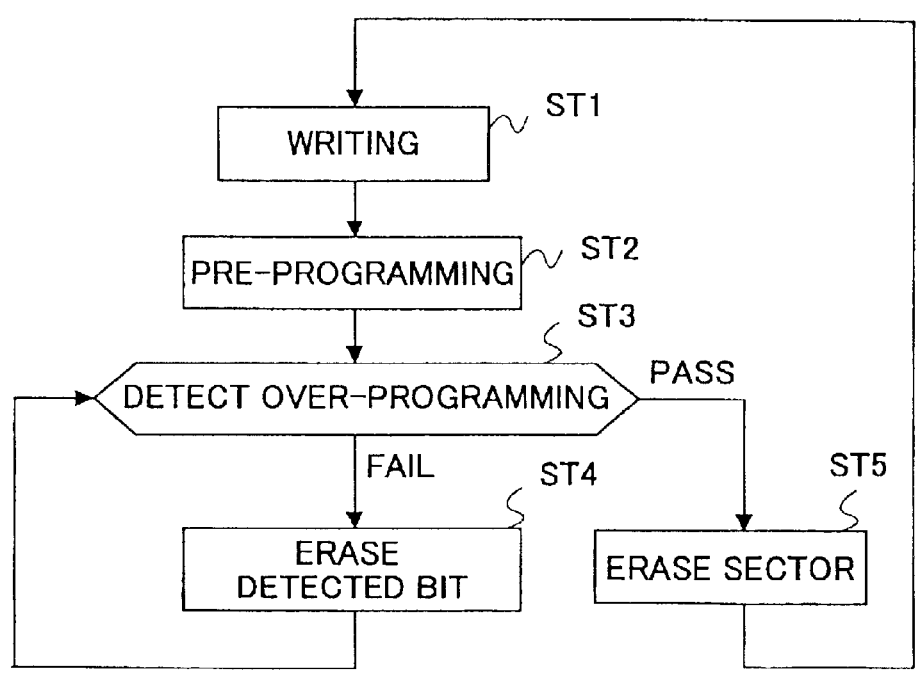
FIG. 4 is a flowchart of a writing operation according to the present invention.

FIG. 4 is a flowchart of a writing operation according to the present invention. The operation shown in the flowchart is performed by the command register and state control unit 11 of FIG. 1 controlling a related part of the semiconductor storage device 10.

In step ST1, writing is performed.

In step ST2, pre-programming is performed. That is, the programming operation is performed on all the cells in a sector before erasing so that the erasing is performed by the sector.

In step ST3, the over-programming detecting operation is performed on each cell. That is, as described with reference to FIGS. 2 and 3, the sense amplifier 17 of FIG. 1 compares the characteristic of each target memory cell in the cell array 16 with the characteristic of the reference cell 34 for over-programming detection of the reference cell 18 shown in FIG. 2, that is, the Vg-Id characteristic 44 shown in FIG. 3. If the data of the memory cell shows a potential higher than the reference potential for over-programming detection, it is determined that the memory cell is over-programmed.

In step ST4, a bit erasing operation is performed on the memory cell determined to be over-programmed. That is, the erasing operation is performed on the over-programmed memory cell so as to correct its over-programmed state. Thereafter, the operation returns to step ST3, and the over-programming detecting operation is again performed.

When it is determined in step ST3 that no memory cell is over-programmed, the operation proceeds to step ST5.

In step ST5, the erasing operation is performed in sectors (the sector is erased).

Thereby, the operation is completed.

Thus, in the present invention, at the time of performing the erasing operation in sectors, the over-programming detecting operation is performed on each memory cell after pre-programming, and the erasing operation is performed on a memory cell determined to be over-programmed until its over-programmed state disappears. Thereby, it can be ensured that an over-programmed memory cell state is eliminated before applying the erasing operation to the entire sector. Thereby, over-erasing due to erasing the entire sector at one time can be controlled, and the broadening of the threshold distribution after erasing can be controlled so that an increase in erasing time can be avoided. In the present invention, the over-programming detecting operation is performed not after a normal writing operation but only after pre-programming. This is because it is more time-efficient to handle over-programming in an erasing sequence since over-programming does not affect the reading itself of data written to a memory cell.

Figure 5:
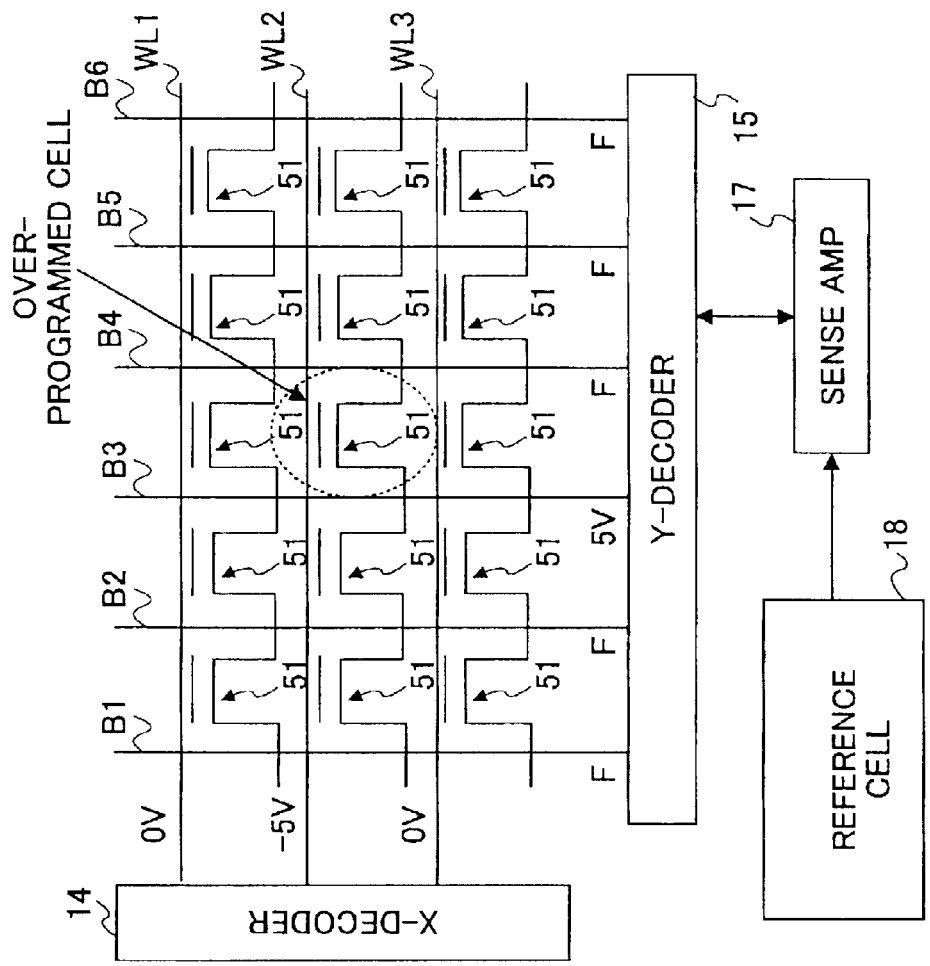
FIG. 5 is a diagram showing a voltage application at the time of correcting over-programming according to the present invention.

FIG. 5 is a diagram showing a voltage application in correcting over-programming according to the present invention.

FIG. 5 shows a cell array formed of a virtual ground array. The cell array includes a plurality of memory cell transistors 51 arranged in rows and columns, sharing drain or source bit lines. Drain or source bit lines B1 through B6 of the memory cell transistors 51 are connected to the Y-decoder 15. Word lines WL1 through WL3 extending from the X-decoder 14 are connected to the gates of the memory cell transistors 51.

In FIG. 5, if the memory cell transistor 51 encircled by the dot line is over-programmed, the over-programming of the memory cell transistor 51 can be corrected by applying a positive voltage (of five volts, for instance) to the drain of the memory cell transistor 51, setting its source in a floating state F, and further applying a negative voltage (of five volts, for instance) to the gate of the memory cell transistor 51.

Figure 6:
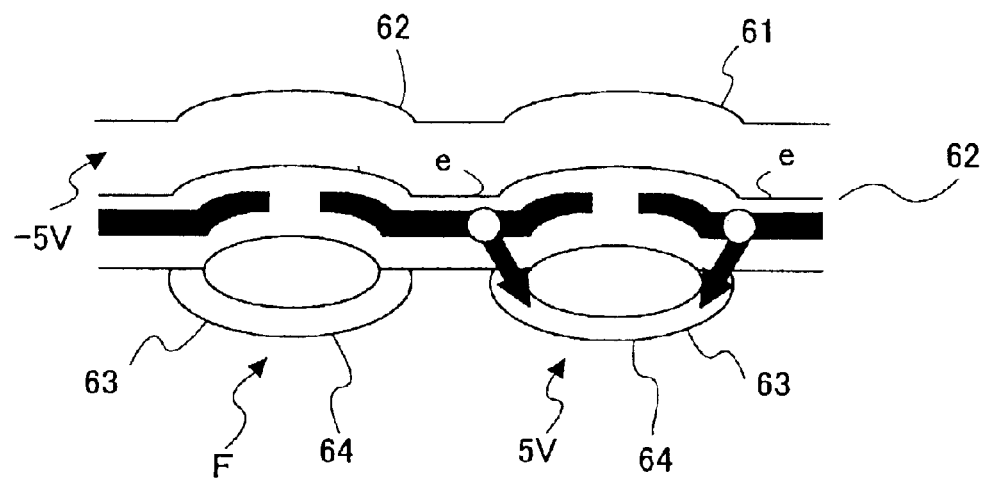
FIG. 6 is a sectional view of a cell of a virtual-ground-array-type flash memory whose bit lines are formed of a diffusion layer according to the present invention.

FIG. 6 is a sectional view of a cell of a virtual-ground-array-type flash memory whose bit lines are formed of a diffusion layer according to the present invention.

The flash memory cell of FIG. 6 includes a word line (gate) 61 of polysilicon, a floating gate 62 of polysilicon, bit-line oxide regions 63 formed of an oxide film, and buried diffusion layer regions 64. In order to set a potential state as shown in FIG. 5, the word line 61 is set at −5 V, one of the diffusion layer regions 64 is set in the floating state F, and the other diffusion layer region 64 is set at 5 V. Thereby, as indicated by the bold arrows in FIG. 6, electric charge e is eliminated from the floating gate 62 in each of the transistors on both sides of the bit line set at 5 V. In the present invention, however, over-programming is corrected after pre-programming. Therefore, the data is already useless, so that the elimination of the electric charges e causes no particular problem.

As described above, the present invention is characterized by the configuration of controlling over-erasing by detecting and correcting over-programming. This configuration is significantly effective in a flash memory using a nitride film as an electric charge trapping layer. This is because the electric charge is prevented from moving into the electric charge trapping layer when a nitride film is used as the electric charge trapping layer. That is, since the electric charge is prevented from moving, the electric charge spreads spatially in the over-programmed state, thus making it impossible to sufficiently eliminate the spatially spreading electric charge by a single erasing operation. Accordingly, it takes a lot of time to erase an over-programmed memory cell.

Figure 7:
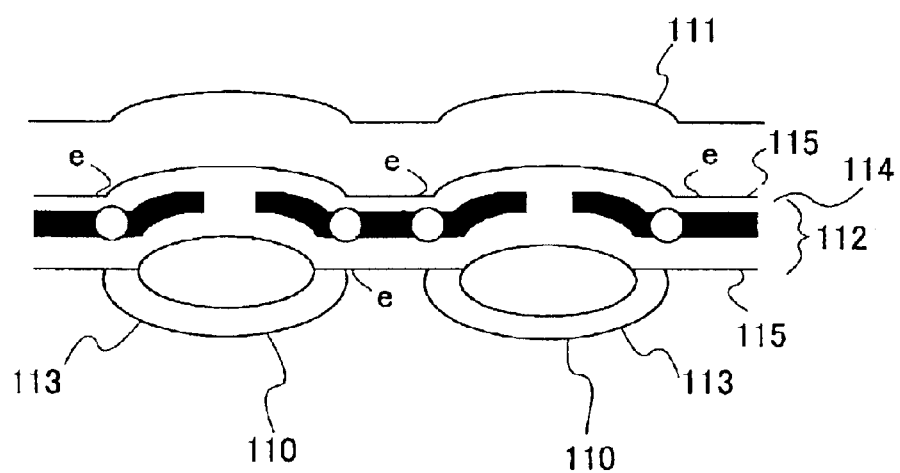
FIG. 7 is a sectional view of a memory cell part of a nonvolatile semiconductor storage device using a nitride film as an electric charge trapping layer according to the present invention.

FIG. 7 is a sectional view of a memory cell part of a nonvolatile semiconductor storage device using a nitride film as an electric charge trapping layer according to the present invention.

The configuration of FIG. 7 includes buried diffusion layer regions 110, a word line 111, an electric charge trapping layer 112, and bit-line oxide regions 113. The electric charge trapping layer 112 has an ONO (Oxide Nitride Oxide) structure including a nitride film 114 and oxide films 115. Thereby, a memory cell transistor capable of storing hot electrons in the electric charge trapping layer 112 is formed. The word line 111 corresponds to the gate of the memory cell transistor, and the buried diffusion layer regions 110 correspond to the source and the drain of the memory cell transistor.

A high voltage (of five volts, for instance) is applied to one of the buried diffusion layer regions 110 of the memory cell transistor as a drain, and the other buried diffusion layer region 110 is connected to a reference potential (power supply ground VSS, for instance) as a source. Further, a high voltage (of ten volts, for instance) is applied to the word line 111 corresponding to the memory cell transistor. Thereby, hot electrons are generated around the drain-side buried diffusion layer region 110 to which the high voltage is applied, so that an electric charge e is injected into the electric charge trapping layer 112. At this point, the electric charge e is stored in the electric charge trapping layer 112 on the side closer to the buried diffusion layer region 110 serving as a drain to which the high voltage is applied.

Next, the above-described drain side is connected to the reference potential this time as the source side, and the high voltage is applied to the above-described source side this time as the drain side. Thereby, an electric charge e can be stored on the opposite side in the electric charge trapping layer 112. By thus injecting the electric charges e into both ends of the electric charge trapping layer 112, two bits can be stored in the single memory cell transistor. This is due to the characteristic that the electric charge is prevented from moving into the nitride film 114 that is the electric charge trapping material of the electric charge trapping layer 112.

In the case of reading out the information of the injected electric charge (electrons), a reading voltage (of one and a half volts, for instance) is applied to the buried diffusion layer region 110 that is on the source side at the time of writing with the other buried diffusion layer region 110 that is on the drain side at the time of writing serving as a reference voltage. Further, a reading gate voltage is applied to the word line 111. Thereby, the reading operation is performed.

Further, in the case of erasing the injected electric charge (electrons), a high voltage (of five volts, for instance) is applied to the buried diffusion layer region 110 that is on the drain side at the time of writing, while the other buried diffusion layer region 110 that is on the source side at the time of writing is set in a floating state. In this state, a negative high voltage (of negative five volts, for instance) is applied to the word line 111. Thereby, by the tunnel phenomenon due to the potential difference between the positive and negative high voltages (of five volts and negative five volts), the electric charge (electrons) trapped in the electric charge trapping layer 112 can be extracted to the high voltage (of five volts, for instance) side. Thereby, the erasing operation is performed.

The above-described present invention is also applicable to a memory cell using a nitride film capable of storing two bits in one memory cell transistor as shown in FIG. 7.

That is, in performing the erasing operation by the sector, the over-programming detecting operation is performed on each memory cell after pre-programming, and the erasing operation is performed on each memory cell determined to be over-programmed until its over-programmed state disappears. Thereby, it can be ensured that no over-programmed memory cell exists at the stage before the erasing operation is performed on the entire sector. Thereby, over-erasing due to erasing the entire sector at one time can be controlled, and the broadening of the threshold distribution after erasing can be controlled so that an increase in erasing time can be avoided. Particularly, a nitride film is employed as the electric charge trapping layer so that electric charge spreads spatially in the over-programmed state, thus making it impossible to sufficiently erase the electric charge spreading spatially by a single erasing operation. Accordingly, the configuration of detecting and correcting over-programming according to the present invention is extremely effective in suppressing an increase in erasing time.

The present invention is not limited to the specifically disclosed embodiment, but variations and modifications may be made without departing from the scope of the present invention.

According to the present invention, in performing the erasing operation by the sector, the over-programming detecting operation is performed on each memory cell after pre-programming, and the erasing operation is performed on each memory cell determined to be over-programmed until its over-programmed state disappears. Thereby, it can be ensured that no over-programmed memory cell exists at the stage before the erasing operation is performed on the entire sector. Thereby, over-erasing due to erasing the entire sector at one time can be controlled, and the broadening of the threshold distribution after erasing can be controlled so that an increase in erasing time can be avoided.

What is claimed is:

1. A nonvolatile semiconductor storage device, comprising:
   a memory cell array;
   a reference cell providing a reference level with which data of said memory cell array is compared so as to determine whether the data of said memory cell array is in an over-programmed state; and
   a control circuit performing an erasing operation on a memory cell in the over-programmed state in said memory cell array when a result of the comparison shows the over-programmed state.

2. The nonvolatile semiconductor storage device as claimed in claim 1, further comprising
   a comparator circuit,
   wherein said control circuit controls said comparator circuit so that said comparator circuit compares the data of said memory cell array with the reference level of said reference cell.

3. The nonvolatile semiconductor storage device as claimed in claim 2, wherein said control circuit controls said comparator circuit so that said comparator circuit compares the data of said memory cell array with the reference level of said reference cell after writing to all bits in a sequence of operations of erasing said memory cell array is completed, the control circuit performing the erasing operation on the memory cell in the over-programmed state in said memory cell array when the result of the comparison shows the over-programmed state.

4. The nonvolatile semiconductor storage device as claimed in claim 1, wherein said memory cell array is formed in a virtual ground array format.

5. The nonvolatile semiconductor storage device as claimed in claim 1, wherein said memory cell array includes a plurality of memory cell transistors each storing data by storing an electric charge in a floating gate.

6. The nonvolatile semiconductor storage device as claimed in claim 1, wherein said memory cell array includes a plurality of memory cell transistors each storing data by storing an electric charge in a nitride film.

7. The nonvolatile semiconductor storage device as claimed in claim 6, wherein each of the memory cell transistors is capable of storing two bits independently of each other by storing the electric charge in each of ends of the nitride film.

8. A method of erasing data in a nonvolatile semiconductor storage device, the method comprising the steps of:
   (a) programming all of a plurality of memory cells in a region to be erased in a memory cell array;
   (b) determining, with respect to each of the memory cells, whether the memory cell is in an over-programmed state by comparing data of the memory cell with a predetermined reference level;
   (c) causing the over-programmed state of a memory cell determined to be in the over-programmed state to disappear by performing an erasing operation on the memory cell; and
   (d) erasing all the memory cells in the region to be erased in the memory cell array after eliminating the over-programmed state from the entire region to be erased.

9. The method as claimed in claim 8, wherein said step (c) performs the erasing operation on individual memory cells determined to be in the over-programmed state independently of each other.

10. The method as claimed in claim 8, wherein the predetermined reference level corresponds to a programmed state higher than a program-verifying reference level.

11. The method as claimed in claim 8, wherein the predetermined reference level of said step (b) is set to be higher than a reference level used for determining whether each of the memory cells is programmed.

* * * * *